(12) United States Patent
Kim

(10) Patent No.: US 8,872,340 B2
(45) Date of Patent: Oct. 28, 2014

(54) SUBSTRATE FOR SEMICONDUCTOR PACKAGE WHICH CAN PREVENT THE SNAPPING OF A CIRCUIT TRACE DESPITE PHYSICAL DEFORMATION OF A SEMICONDUCTOR PACKAGE AND SEMICONDUCTOR PACKAGE HAVING THE SAME

(71) Applicant: SK Hynix Inc., Icheon-si (KR)

(72) Inventor: Jong Hoon Kim, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/842,810

(22) Filed: Mar. 15, 2013

(65) Prior Publication Data

US 2014/0021602 A1   Jan. 23, 2014

(30) Foreign Application Priority Data

Jul. 17, 2012  (KR) .................. 10-2012-0077640
Dec. 28, 2012  (KR) .................. 10-2012-0155678

(51) Int. Cl.
    *H01L 23/498*    (2006.01)
(52) U.S. Cl.
    CPC . *H01L 23/49811* (2013.01); *H01L 2224/16225* (2013.01); *H01L 2224/32225* (2013.01); *H01L 2224/48227* (2013.01); *H01L 2224/73204* (2013.01); *H01L 2224/73265* (2013.01); *H01L 2924/15311* (2013.01); *H01L 2924/3011* (2013.01)
    USPC ............ 257/750; 257/E23.023; 257/E23.114; 257/737; 257/738; 257/778; 257/775; 257/776; 257/700; 257/701; 257/702; 257/532; 257/735; 257/736; 257/783

(58) Field of Classification Search
    USPC ......... 257/737, 738, 778, 774, 773, 775, 776, 257/700, 701, 702, 532, 735, 736, 783, 257/E23.023, E23.114
    See application file for complete search history.

(56) References Cited

U.S. PATENT DOCUMENTS

| 6,384,344 | B1 * | 5/2002 | Asai et al. ..................... 174/261 |
| 8,247,703 | B2 * | 8/2012 | Das et al. ...................... 174/260 |
| 8,259,454 | B2 * | 9/2012 | Fillion et al. .................. 361/746 |
| 8,530,848 | B2 * | 9/2013 | Cok .......................... 250/370.01 |
| 2003/0219588 | A1 * | 11/2003 | Ogawa et al. ............. 428/308.4 |
| 2004/0256731 | A1 * | 12/2004 | Mao et al. ..................... 257/773 |
| 2006/0220500 | A1 * | 10/2006 | Shimada et al. ............. 310/348 |
| 2008/0014336 | A1 * | 1/2008 | Asai et al. .................... 427/97.6 |
| 2010/0007017 | A1 * | 1/2010 | Wei et al. ...................... 257/737 |

FOREIGN PATENT DOCUMENTS

| KR | 1020050053246 A | 6/2005 |
| KR | 1020100123415 A | 11/2010 |

* cited by examiner

*Primary Examiner* — Alexander Oscar Williams
(74) *Attorney, Agent, or Firm* — William Park & Associates Patent Ltd.

(57) ABSTRACT

A substrate for a semiconductor package includes: a first dielectric having a first surface and a second surface which faces away from the first surface and possesses waveform shaped portions, and formed with first holes penetrating the first and second surfaces; and circuit traces formed over the second surface of the first dielectric and having waveform shaped portions disposed over the waveform shaped portions of the second surface of the first dielectric. The waveform shaped portions of the second surface of the first dielectric and the waveform shaped portions of the circuit traces form a stress-resistant structure.

25 Claims, 6 Drawing Sheets

US 8,872,340 B2

SUBSTRATE FOR SEMICONDUCTOR PACKAGE WHICH CAN PREVENT THE SNAPPING OF A CIRCUIT TRACE DESPITE PHYSICAL DEFORMATION OF A SEMICONDUCTOR PACKAGE AND SEMICONDUCTOR PACKAGE HAVING THE SAME

CROSS-REFERENCE TO RELATED APPLICATIONS

The present application claims priorities to Korean Patent Applications Numbers 10-2012-0077640 filed on Jul. 17, 2012 and 10-2012-0155678 filed on Dec. 28, 2012 in the Korean Intellectual Property Office, which are incorporated herein by reference in their entireties.

BACKGROUND OF THE INVENTION

1. Field of Invention

The present invention generally relates to a semiconductor package, and more particularly, to a substrate for a semiconductor package which can minimize the occurrence of a crack in a circuit trace even when an external stress is applied, and a semiconductor package having the same.

2. Description of the Related Art

A BGA (ball grid array) package and an FBGA (fine ball grid array) package are representative examples of Chip scale semiconductor packages. These packages use ball type leads, that is, conductive solder balls, as terminals for electrically coupling a semiconductor chip with an outside. The conductive solder balls are formed in such a manner that patterns of a conductive substance are attached to the back side of a printed circuit board in a matrix type to define an array. The FBGA package as a kind of the BGA package adopts solder balls which are relatively small when compared to those of the BGA package and are arranged with a narrow spacing.

Unlike a conventional plastic package, the BGA package uses a printed circuit board (PCB) instead of a lead frame. Since the printed circuit board can provide an entire surface facing away from a surface to which a semiconductor chip is attached, as a region for disposing solder balls, advantages are provided in terms of mounting density with respect to a mother board.

As the printed circuit board is widely used as various kinds of boards for electronic systems, the printed circuit board plays an important role along with a semiconductor device in configuring the electronic systems.

Meanwhile, as integrated circuits rapidly trend toward a high speed operation and a high degree of integration, the number of input/output terminals has increased when packaging a semiconductor device. Due to this fact, the number of balls of the BGA package has increased, and the density of circuit traces of the printed circuit board which is used as a packaging substrate has continuously increased.

That is to say, with development of a semiconductor design technology and a semiconductor device technology, the operation speed of an apparatus is being increased and an operation voltage is being lowered. In this case, a spacing between circuit traces should be increased to prevent short-circuiting of the circuit traces of the printed circuit board, and the width of the circuit traces should be decreased to improve a characteristic impedance. However, as the width of the circuit traces is decreased, the mechanical strength of the circuit traces deteriorates. Thus, in the case where physical deformation occurs in a semiconductor package, a problem may be caused in that the circuit traces are apt to snap.

BRIEF SUMMARY OF THE INVENTION

Various embodiments are directed to a substrate for a semiconductor package which can prevent the snapping of a circuit trace despite physical deformation of a semiconductor package, and a semiconductor package having the same.

In an embodiment, a substrate includes: a first dielectric having a first surface and a second surface which faces away from the first surface and possesses waveform shaped portions; and a circuit trace formed over the second surface of the first dielectric and having substantially the same waveform shaped portions as the second surface of the first dielectric.

In an embodiment, a substrate for a semiconductor package includes: a first dielectric having a first surface and a second surface which faces away from the first surface and possesses waveform shaped portions, and formed with first holes penetrating the first and second surfaces; and circuit traces formed over the second surface of the first dielectric and having waveform shaped portions disposed over the waveform shaped portions of the second surface of the first dielectric, wherein the waveform shaped portions of the second surface of the first dielectric and the waveform shaped portions of the circuit traces form a stress-resistant structure.

The circuit trace may include: a first electrode disposed over the first hole and the adjacent portion of the second surface of the first dielectric, a second electrode disposed over a portion of the second surface of the first dielectric which is spaced apart from the first electrode, and a connection part disposed over the second surface of the first dielectric and having the waveform shaped portion such that the first and second electrodes are connected with each other by means of the connection part. The waveform shaped portion of the connection part may be formed substantially in a horizontal direction with respect to the second surface of the first dielectric.

The substrate for a semiconductor package may further include: a second dielectric formed over the second surface of the first dielectric to cover the circuit traces and having second holes for exposing the second electrodes of the circuit traces. The substrate for a semiconductor package may further include: additional circuit traces formed over the first surface of the first dielectric; and through lines formed in the first holes to connect the additional circuit trace and the first electrode of the circuit trace formed over the second surface of the first dielectric.

The additional circuit trace may include: a third electrode connected with the through line, a fourth electrode disposed over a portion of the first surface of the first dielectric which is spaced apart from the third electrode, and an additional connection part for connecting the third and fourth electrodes.

The substrate for a semiconductor package may further include: a third dielectric formed over the first surface of the first dielectric to cover the additional circuit traces and having third holes for exposing the fourth electrodes.

The first surface of the first dielectric has a waveform shaped portion for disposing the additional connection part thereon. The additional connection part of the circuit trace disposed over the waveform shaped portion of the first surface has a waveform shape.

The waveform shaped portion of the first surface of the first dielectric and the waveform shaped additional connection part of the additional circuit trace form an additional stress-resistant structure.

In an embodiment, a semiconductor package includes: a substrate including a first dielectric having a first surface and a second surface which faces away from the first surface and possesses waveform shaped portions, and formed with first holes penetrating the first and second surfaces, and circuit traces formed over the second surface of the first dielectric and having waveform shaped portions disposed over the waveform shaped portions of the second surface of the first dielectric, wherein the waveform shaped portions of the second surface of the first dielectric and the waveform shaped portions of the circuit traces form a stress-resistant structure; a semiconductor chip disposed over the second surface of the first dielectric and having bonding pads disposed over one surface thereof; and first connection electrodes for electrically connecting the circuit traces of the substrate and the bonding pads of the semiconductor chip.

The circuit trace may include: a first electrode disposed over the first hole and the adjacent portion of the second surface of the first dielectric, a second electrode disposed over a portion of the second surface of the first dielectric which is spaced apart from the first electrode, and a connection part disposed over the second surface of the first dielectric and having the waveform shaped portion such that the first and second electrodes are connected with each other by means of the connection part. The waveform shaped portion of the connection part may be formed substantially parallel to the second surface of the first dielectric.

The substrate may further include: a second dielectric formed over the second surface of the first dielectric to cover the circuit traces and having second holes for exposing the second electrodes of the circuit traces.

The semiconductor chip may be disposed in a face-down type such that the surface of the semiconductor chip formed with the bonding pads faces the second surface of the first dielectric, and the first connection electrodes may be formed over the bonding pads and include bumps which are in contact with the circuit traces.

The semiconductor package may further include: an underfill formed in a space between the substrate and the semiconductor chip.

The semiconductor chip is disposed in a face-up type such that the surface of the semiconductor chip formed with the bonding pads faces away from the second surface of the first dielectric, and the first connection electrodes may include conductive wires.

The semiconductor package may further include: an adhesive member interposed between the substrate and the semiconductor chip. The semiconductor package may further include: second connection electrodes formed over the first surface of the first dielectric and electrically connected with the circuit traces of the substrate through the first holes, and an encapsulation member formed over the substrate to cover the semiconductor chip and the first connection electrodes. The substrate may further include: additional circuit traces formed over the first surface of the first dielectric; and through lines formed in the first holes to connect the additional circuit trace and the first electrode of the circuit trace formed over the second surface of the first dielectric.

The additional circuit trace may include: a third electrode connected with the through line, a fourth electrode disposed over a portion of the first surface of the first dielectric which is spaced apart from the third electrode, and an additional connection part for connecting the third and fourth electrodes.

The substrate may further include: a third dielectric formed over the first surface of the first dielectric to cover the additional circuit traces and having third holes for exposing the fourth electrodes.

The first surface of the first dielectric has a waveform shaped portion for disposing the additional connection part thereon. The additional connection part of the circuit trace disposed over the waveform shaped portion of the first surface has a waveform shape. The waveform shaped portion of the first surface of the first dielectric and the waveform shaped additional connection part of the additional circuit trace form an additional stress-resistant structure.

The semiconductor package may further include: second connection electrodes formed over the third dielectric and electrically connected with the fourth electrodes of the additional circuit traces through the third holes.

In an embodiment, an electronic system including a bus coupled with a memory and controller, the memory and controller including a semiconductor package includes: a substrate including: a first dielectric having a first surface and a second surface which faces away from the first surface and possesses waveform shaped portions, and formed with first holes penetrating the first and second surfaces; and circuit traces formed over the second surface of the first dielectric and having waveform shaped portions disposed over the waveform shaped portions of the second surface of the first dielectric, wherein the waveform shaped portions of the second surface of the first dielectric and the waveform shaped portions of the circuit traces form a stress-resistant structure; a semiconductor chip disposed over the second surface of the first dielectric and having bonding pads disposed over one surface thereof; and first connection electrodes for electrically connecting the circuit traces of the substrate and the bonding pads of the semiconductor chip.

In an embodiment, an electronic system including an interface coupled to a bus, the bus coupled with a memory and controller, the memory and controller including a semiconductor package includes: a substrate including: a first dielectric having a first surface and a second surface which faces away from the first surface and possesses waveform shaped portions, and formed with first holes penetrating the first and second surfaces; and circuit traces formed over the second surface of the first dielectric and having waveform shaped portions disposed over the waveform shaped portions of the second surface of the first dielectric, wherein the waveform shaped portions of the second surface of the first dielectric and the waveform shaped portions of the circuit traces form a stress-resistant structure; a semiconductor chip disposed over the second surface of the first dielectric and having bonding pads disposed over one surface thereof; and first connection electrodes for electrically connecting the circuit traces of the substrate and the bonding pads of the semiconductor chip.

In an embodiment, a memory card including a memory and a memory controller, the memory including a substrate including: a first dielectric having a first surface and a second surface which faces away from the first surface and possesses waveform shaped portions, and formed with first holes penetrating the first and second surfaces; and circuit traces formed over the second surface of the first dielectric and having waveform shaped portions disposed over the waveform shaped portions of the second surface of the first dielectric, wherein the waveform shaped portions of the second surface of the first dielectric and the waveform shaped portions of the circuit traces form a stress-resistant structure.

DETAILED DESCRIPTION

Hereafter, various embodiments will be described in detail with reference to the accompanying drawings.

It is to be understood herein that the drawings are not necessarily to scale and in some instances proportions may have been exaggerated in order to more clearly depict certain features of the invention.

Figure 1:
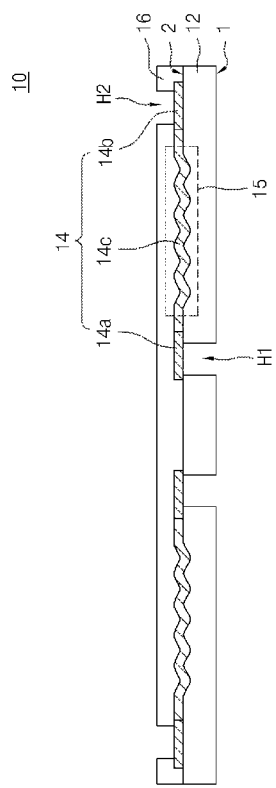
FIG. 1 is a cross-sectional view illustrating a substrate for a semiconductor package in accordance with an embodiment.

FIG. 1 is a cross-sectional view illustrating a substrate for a semiconductor package in accordance with an embodiment.

Referring to FIG. 1, a substrate 10 for a semiconductor package in accordance with an embodiment may include a first dielectric 12 and circuit traces 14.

The first dielectric 12 may have a structure in which a dielectric formed of epoxy resin covers the outside of a glass fiber. The first dielectric 12 may possess a first surface 1 and a second surface 2 which faces away from the first surface 1. Particularly, the second surface 2 of the first dielectric 12 may have a waveform shaped portion. The first dielectric 12 may further have a plurality of first holes H1 that penetrate the first surface 1 and the second surface 2.

Although the first holes H1 are shown as being formed in two rows when viewed from above in the present embodiment, the first holes H1 may be formed in more than two rows. Furthermore, although the first holes H1 are shown as being formed in the center of the first dielectric 12 in the present embodiment, they may be formed in both edges of the first dielectric 12. Additionally, as will be described later, the first holes H1 may be formed in portions of the first dielectric 12 corresponding to first electrodes 14a of the circuit traces 14 that are formed over the second surface 2 of the first dielectric 12.

The circuit traces 14 may be formed, for example, over the second surface 2 of the first dielectric 12. The circuit traces 14 may be formed of a substance which has conductivity and elasticity, for example, copper and such. The circuit trace 14 may include a first electrode 14a, a second electrode 14b and a connection part 14c connecting the first electrode 14a and the second electrode 14b. The first electrode 14a may be disposed over the first hole H1 and the adjacent portion, such that the first electrode 14a may be exposed by the first hole H1. The second electrode 14b may be disposed over a portion of the second surface 2 which is spaced apart from the first electrode 14a, e.g. over an edge of the second surface 2 of the first dielectric 12. The connection part 14c may be disposed over a portion of the second surface 2 of the first dielectric 12 which is between the first and second electrodes 14a and 14b and has a waveform shape.

In the present embodiments, the substrate 10 for a semiconductor package may have a stress-resistant structure 15, which includes a waveform shaped portion of the second surface 2 of the first dielectric 12 and the connection part 14c formed over the waveform shaped portion of the second surface 2 and having a corresponding waveform shape. Herein, the waveform shaped portion of the connection part 14c may be formed horizontally with respect to the second surface of the first dielectric 12.

The substrate 10 for a semiconductor package in accordance with an embodiment may further include a second dielectric 16 formed over the second surface 2 of the first dielectric 12 so as to cover the circuit traces 14 and having second holes H2 for allowing the second electrodes 14b of the circuit traces 14 to be exposed. For example, the second dielectric 16 may be a solder resist.

In the substrate 10 for a semiconductor package in accordance with an embodiment as described above, the stress-resistant structure 15, which consists of the waveform shaped portions of the second surface 2 of the first dielectric 12 and the waveform shaped portions of the circuit traces 14 provided over the waveform shaped portions of the second surface 2, serves to absorb a stress applied from an outside. Therefore, the circuit traces 14 may be easily deformed like a spring when an external stress is applied, so that no defect such as snapping can occurs.

Consequently, the substrate 10 for a semiconductor package in accordance with an embodiment has mechanical reliability and a semiconductor package employing such substrate also has an improved reliability.

Figure 2:
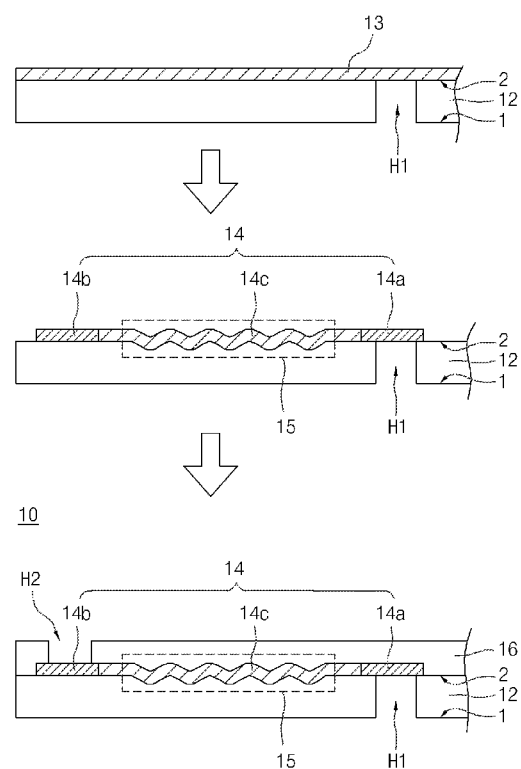
FIG. 2 is cross-sectional views explaining a manufacturing procedure of the substrate for a semiconductor package in accordance with an embodiment.

FIG. 2 illustrates cross-sectional views explaining a manufacturing procedure of the substrate for a semiconductor package in accordance with an embodiment.

Referring FIG. 2, the first dielectric 12 having a substantially plate shape and possessing the first surface 1 and the second surface 2 which faces away from the first surface 1 is prepared. The first holes H1 are formed in portions of the first dielectric 12, i.e. the portions where the first electrodes of the circuit traces are to be subsequently disposed and then a copper foil 13 is attached to the second surface 2 of the first dielectric 12 formed with the first holes H1.

In an alternative embodiment, a first dielectric 12 possessing the first surface 1 and the second surface 2 to which a copper foil 13 is attached may be prepared and thereafter the first holes H1 may be formed in the portions of the first dielectric 12.

In succession, the copper foil 13 attached to the second surface 2 of the first dielectric 12 is pressed, for example, by way of a heat press having a portion with a waveform-shaped surface. Thereafter, the pressed copper foil 13 is patterned by photolithography and etching processes to form the circuit traces 14. The circuit traces 14 may include a first electrode 14a disposed over the first hole H1 and the adjacent portion, a second electrode 14b disposed over an edge of the second surface 2 of the first dielectric 12 which is spaced apart from the first electrode 14a, and a connection part 14c disposed between the first and second electrodes 14a and 14b.

Herein, with the heat press, the connection part 14c disposed between the first electrode 14a and the second electrode 14b has a substantially waveform shape, which results in formation of the stress-resistant structure 15.

In succession, the second dielectric 16, which may be a solder resist, may be formed over the second surface 2 of the first dielectric 12 to cover the circuit traces 14. Thereafter, portions of the second dielectric 16 are etched to form the second holes H2 for allowing the second electrodes 14b of the circuit traces 14 to be exposed, thereby completing the fabrication of the substrate 10 for a semiconductor package.

Figure 3:
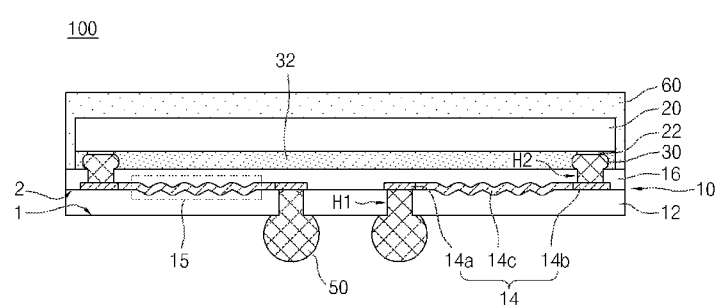
FIG. 3 is a cross-sectional view illustrating a semiconductor package in accordance with an embodiment, which has the substrate of FIG. 1.

FIG. 3 is a cross-sectional view illustrating a semiconductor package in accordance with an embodiment, which has the substrate 10 of FIG. 1.

Referring to FIG. 3, a semiconductor package 100 may include a substrate 10 having a stress-resistant structure 15, a semiconductor chip 20 and first connection electrodes 30.

The substrate 10 may include, as described above, a first dielectric 12, circuit traces 14 and a second dielectric 16.

The first dielectric 12 may possess a first surface 1 and a second surface 2 which faces away from the first surface 1. The second surface 2 may have a waveform shape portion. The first surface 1 may further have a plurality of first holes H1 that penetrate the first and second surfaces 1 and 2.

The circuit traces 14 may be formed over the second surface 2 of the first dielectric 12. The circuit traces 14 may be formed of a substance which has conductivity and elasticity, for example, copper and such. The circuit traces 14 may include a first electrode 14a, a second electrode 14b and a connection part 14c connecting the first and second electrodes 14a and 14b. The first electrode 14a may be disposed over the first hole H1 and the adjacent portion. The second electrode 14b may be disposed over an edge of the second surface 2 which is spaced apart from the first electrode 14a. The connection part 14c may be disposed over a portion of the second surface 2 of the first dielectric 12, which is between the first and second electrodes 14a and 14b and includes the waveform shaped portion of the second surface 2. Herein, the first electrode 14a is exposed by the first hole H1.

In the present embodiment, the substrate 10 may have a stress-resistant structure 15, which includes a waveform shaped portion of the second surface 2 of the first dielectric 12 and the connection part 14c formed over the waveform shaped portion of the second surface 2 and having a corresponding waveform shape. Herein, the waveform shaped portion of the connection part 14c may be formed horizontally with respect to the second surface 2 of the first dielectric 12.

The second dielectric 16 may be formed over the second surface 2 of the first dielectric 12 so as to cover the circuit traces 14. The second dielectric 16 may have a plurality of second holes H2 for allowing the second electrodes 14b of the circuit traces 14 to be exposed. For example, the second dielectric 16 may be formed of a solder resist.

The semiconductor chip 20 may include bonding pads 22 formed over one surface thereof. The semiconductor chip 20 may be disposed over the substrate 10 in a face-down type such that the surface of the semiconductor chip 20 formed with the bonding pads 22 faces the second surface 2 of the first dielectric 12. The bonding pads 22 may be disposed at the positions corresponding to the second electrodes 14b of the substrate 10.

First connection electrodes 30 may be formed over the bonding pads 22 and pass through the second holes H2 to be connected with the second electrodes 14b. Accordingly, each of the bonding pads 22 of the semiconductor chip 20 is electrically connected with corresponding circuit trace of the substrate 10 via the first connection electrode 30. For example, the first connection electrodes 30 may include a bump.

The semiconductor package 100 in accordance with an embodiment may further include second connection electrodes 50 which are connected to the first electrodes 14a of the circuit traces 14 exposed from the lower surface of the substrate 10, i.e. the first surface 1 of the first dielectric 12. For example, the second connection electrodes 50 may include a solder ball.

The semiconductor package 100 in accordance with an embodiment may further include an under-fill 32 formed in a space between the substrate 10 and the semiconductor chip 20 disposed over the substrate 10 in a face-down type.

The semiconductor package 100 in accordance with an embodiment may further include an encapsulation member 60 formed over the upper surface of the substrate 10 to cover the semiconductor chip 20 such that the semiconductor chip 20 can be prevented from being damaged by external factors. For example, the encapsulation member may include an epoxy molding compound (EMC).

With the semiconductor package in accordance with an embodiment, of which substrate including a stress-resist structure, the stress-resist structure serves to absorb a stress applied from the outside when the stress is applied to the substrate. Therefore, there occurs substantially no defect such as snapping of the circuit traces of the substrate, resulting in an improved reliability of the semiconductor package.

Figure 4:
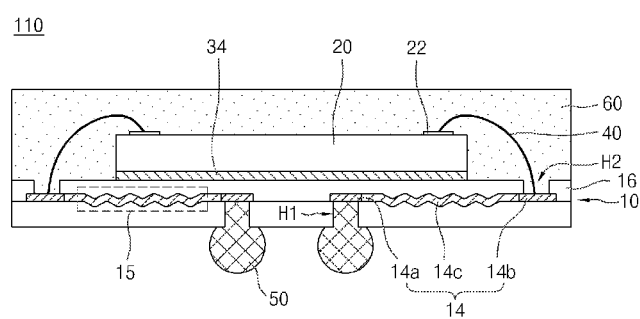
FIG. 4 is a cross-sectional view illustrating a semiconductor package in accordance with an embodiment, which has the substrate of FIG. 1.

FIG. 4 is a cross-sectional view illustrating a semiconductor package in accordance with an embodiment, which has the substrate 10 of FIG. 1. Here, the same component parts as those shown in FIG. 3 will be denoted by the same reference numerals.

Referring to FIG. 4, a semiconductor package 110 in accordance with an embodiment may include a substrate 10, a semiconductor chip 20 and first connection electrodes 40.

The substrate 10 may have a stress-resistant structure 15, which is the same as that of the previous embodiment.

The semiconductor chip 20 may include bonding pads 22 formed over one surface thereof. The semiconductor chip 20 may be attached to the substrate in a face-up type by the medium of an adhesive member 34 such that the surface of the semiconductor chip 20 formed with the bonding pads 22 faces away from the substrate 10.

The first connection electrodes 40 may, unlike those of the previous embodiment, be formed of a conductive wire. Accordingly, in this embodiment, the bonding pads 22 of the semiconductor chip 20 and the second electrodes 14b of the circuit traces 14 of the substrate 10 are electrically connected with each other by the conductive wires that penetrate through the second holes H2 of the second dielectric 16.

The semiconductor package 110 in accordance with an embodiment may further include second connection electrodes 50 which are connected with the first electrodes 14a of the circuit traces 14 through the first holes H1. The second connection electrodes 50 may include a solder ball.

The semiconductor package 100 in accordance with an embodiment may further include an encapsulation member 60 formed over the upper surface of the substrate 60 to cover the semiconductor chip 20 and the first connection electrodes 40 formed of a conductive wire such that the semiconductor chip 20 can be prevented from being damaged from the external factors. For example, the encapsulation member 60 may include an EMC.

Figure 5:
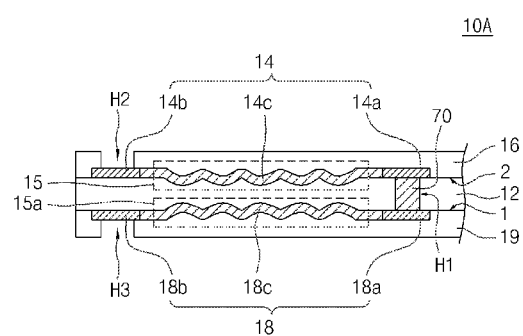
FIG. 5 is a cross-sectional view illustrating a substrate for a semiconductor package in accordance with an embodiment.

FIG. 5 is a cross-sectional view illustrating a substrate for a semiconductor package in accordance with an embodiment. Here, the same component parts as those shown in FIG. 1 will be denoted by the same reference numerals.

Referring to FIG. 5, a substrate 10A for a semiconductor package in accordance with an embodiment may include a first dielectric 12, a circuit traces 14 and additional circuit traces 18.

The first dielectric 12 may possess a first surface 1 and a second surface 2 which faces away from the first surface 1. Particularly, the first surface 1 of the substrate 10A as well as the second surface 2 of the substrate 10A may have waveform shaped portions. The first dielectric 12 may include a plurality of first holes H1 that penetrate the first and second surfaces 1 and 2 and through lines 70 formed in the first holes H1.

The circuit traces 14 may be formed over the second surface 2 of the first dielectric 12. The circuit traces 14 may be formed of a substance which has conductivity and elasticity, for example, copper and such. The circuit traces 14 may include a first electrode 14a, a second electrode 14b and a connection part 14c connecting the first electrode 14a and the second electrode 14b. The connection part 14c may be disposed over a portion of the second surface 2 of the first dielectric 12, which is between the first electrode 14a and the second electrode 14b and has a waveform shape.

In the present embodiment, the substrate 10A for a semiconductor package may have a stress-resistant structure 15, which includes a waveform shaped portion of the second surface 2 of the first dielectric 12 and the connection part 14c formed over the waveform shaped portion of the second surface 2 and having a corresponding waveform shape.

The additional circuit traces 18 may be formed over the first surface 1 of the first dielectric 12. The additional circuit traces 18 may include a third electrode 18a connected with the first electrode 14a by way of the through line 70, a fourth electrode 18b spaced apart from the third electrode 18a and an additional connection part 18c connecting the third electrode 18a and the fourth electrode 18b. Here, the third electrode 18a is preferably disposed under the first electrode 14a such that the third electrode may be connected with the first electrode 14a by way of the through line 70. The fourth electrode may be positioned under the second electrode 14b. However, the position of the fourth electrode 18b may be freely varied.

In the present embodiment, the additional connection part 18c may be formed over a waveform shaped portion of the first surface 1 of the first dielectric 12 and have a corresponding waveform shape. Accordingly, the substrate 10A for a semiconductor package in accordance with an embodiment has an additional stress-resistant structure 15a, which includes the waveform shaped portion of the first surface 1 of the first dielectric and the additional connection part 18c formed over the waveform shaped portion of the first surface 1 and having a corresponding waveform shape. Since the substrate 10A for a semiconductor package in accordance with an embodiment is formed with the stress-resistant structure 15 as well as the additional stress-resistant structure 15a, snapping of not only the circuit traces 14 formed over the second surface 2 of the first dielectric 12 but also the additional circuit traces 18 formed over the first surface 1 of the first dielectric 12 can be effectively prevented.

The substrate 10A for a semiconductor package in accordance with an embodiment may further include a second dielectric 16 formed over the second surface 2 of the first dielectric 12 to cover the circuit traces 14 and have second holes H2 that expose the second electrodes 14b of the circuit traces 14. The substrate 10A for a semiconductor package in accordance with an embodiment may further include a third dielectric 19 formed over the first surface 1 of the first dielectric 12 to cover the additional circuit traces 18 and have third holes H3 that expose the fourth electrodes 18b of the additional circuit traces 18. For example, the second and third dielectrics 16 and 19 may be a solder resist.

Figure 6:
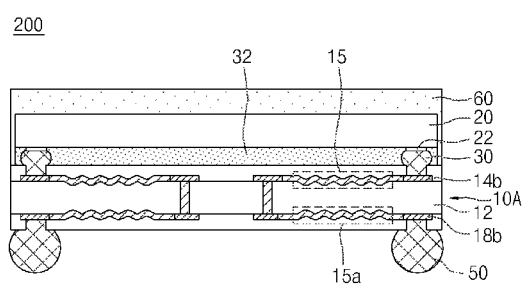
FIG. 6 is a cross-sectional view illustrating a semiconductor package in accordance with an embodiment, which has the substrate of FIG. 5.
Figure 7:
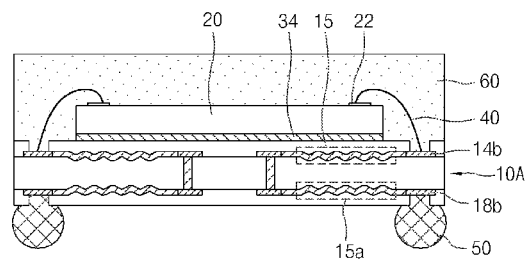
FIG. 7 is a cross-sectional view illustrating a semiconductor package in accordance with an embodiment, which has the substrate of FIG. 5.

FIG. 6 is a cross-sectional view illustrating a semiconductor package in accordance with an embodiment, which has the substrate of FIG. 5 and FIG. 7 is a cross-sectional view illustrating a semiconductor package in accordance with another embodiment, which has the substrate of FIG. 5. The same component parts as those of the previous embodiment will be denoted by the same reference numerals and not be described again.

Referring to FIG. 6, a semiconductor package 200 in accordance with an embodiment may include a substrate 10A, a semiconductor chip 20 and first connection electrodes 30.

The substrate 10A may include, as described with reference to FIG. 5, a stress-resistant structure 15 and an additional stress-resistant structure 15a. The semiconductor chip 20 may include bonding pads 22 formed over one surface thereof. The semiconductor chip 20 may be disposed over the substrate 10A in a face-down type, such that the surface of the semiconductor chip 20 formed with the bonding pads 22 faces the substrate 10A. The first connection electrodes 30 may be formed over the bonding pads 22 and connected with the second electrodes 14b of the circuit traces 14. For example, the first connection electrodes 30 may include a bump.

The semiconductor package 200 in accordance with an embodiment may further include second connection electrodes 50 connected to the fourth electrodes 18b of the additional circuit traces exposed by the third holes H3. The second connection electrodes 50 may be a solder ball. The semiconductor package 200 in accordance with an embodiment may further include an under-fill 32 formed in a space between the substrate 10A and the semiconductor chip 20 disposed over the substrate 10A in a face-down type and an encapsulation member 60 formed over the upper surface of the substrate 10A to cover the semiconductor chip 20. For example, the encapsulation member may be an EMC.

Referring to FIG. 7, a semiconductor package 210 in accordance with an embodiment may include a substrate 10A, a semiconductor chip 20 and first connection electrodes 40.

The substrate 10A may include, as described with reference to FIG. 5, a stress-resistant structure 15 and an additional stress-resistant structure 15a. The semiconductor chip 20 may include bonding pads 22 formed over one surface thereof and attached to the substrate 10A in a face-up type by the medium of an adhesive member 34, such that the surface of the semiconductor chip 20 formed with the bonding pads 22 faces away from the substrate 10A. The first connection electrodes 40 may be formed of a conductive wire and electrically connect the bonding pad 22 of the semiconductor chip 20 and corresponding second electrode 14b of the circuit traces of the substrate 10A with each other.

The semiconductor package 210 in accordance with an embodiment may further include second connection electrodes 50 such as a solder ball, which is connected to the fourth electrodes 18b of the additional circuit traces exposed by the third holes H3.

The semiconductor package 210 in accordance with an embodiment may further include an encapsulation member 60 such as an EMC formed over the substrate 10A to cover the semiconductor chip 20.

The semiconductor package described above may be applied to various kinds of semiconductor devices and package modules having the same.

Figure 8:
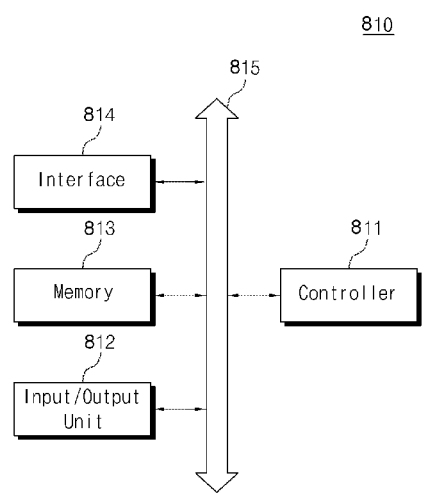
FIG. 8 is a system block diagram of an electronic apparatus to which the semiconductor package according to an embodiment is applied.

FIG. 8 is a system block diagram of an electronic apparatus to which the semiconductor package according to the various embodiments is applied.

Referring to FIG. 8, the semiconductor package in accordance with an embodiment may be applied to an electronic system 810. An electronic system 810 may include a controller 811, an input/output unit 812, and a memory 813. The controller 811, the input/output unit 812 and the memory 813 may be coupled with one another through a bus 815 providing a path through which data move.

For example, the controller 811 may include at least any one of at least one microprocessor, at least one digital signal processor, at least one microcontroller, and logic devices capable of performing the same functions as these components. The controller 811 and the memory 813 may include at least any one of the semiconductor package according to the embodiment of the present invention. The input/output unit 812 may include at least one selected among a keypad, a keyboard, a display device, and so forth. The memory 813 is a device for storing data. The memory 813 may store data and/or commands to be executed by the controller 811, and the likes.

The memory 813 may include a volatile memory device such as a DRAM and/or a nonvolatile memory device such as a flash memory. For example, a flash memory may be mounted to an information processing system such as a mobile terminal or a desk top computer. The flash memory may be constituted by a semiconductor disc device (SSD). In this case, the electronic system 810 may stably store a large amount of data in a flash memory system.

The electronic system 810 may further include an interface 814 configured to transmit and receive data to and from a communication network. The interface 814 may be a wired or wireless type. For example, the interface 814 may include an antenna or a wired or wireless transceiver. Further, the electronic system 810 may be additionally provided with an application chipset, a camera image processor (CIS), an input/output unit, etc.

The electronic system 810 may be realized as a mobile system, a personal computer, an industrial computer or a logic system performing various functions. For example, the mobile system may be any one of a personal digital assistant (PDA), a portable computer, a web tablet, a mobile phone, a smart phone, a wireless phone, a laptop computer, a memory card, a digital music system and an information transmission/reception system.

In the case where the electronic system 810 is an equipment capable of performing wireless communication, the electronic system 810 may be used in a communication system such as of CDMA (code division multiple access), GSM (global system for mobile communication), NADC (north American digital cellular), E-TDMA (enhanced-time division multiple access), WCDAM (wideband code division multiple access), CDMA2000, LTE (long term evolution) and Wibro (wireless broadband Internet).

Figure 9:
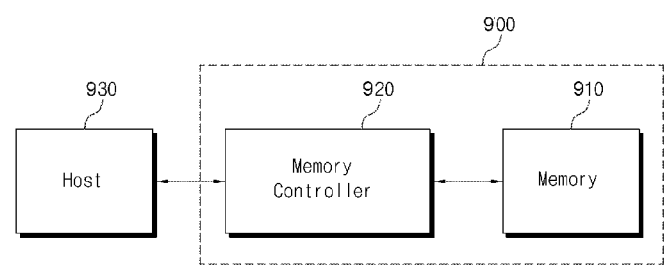
FIG. 9 is a block diagram showing an example of an electronic apparatus which includes the semiconductor package according to an embodiment.

FIG. 9 is a block diagram showing an example of an electronic apparatus which may include the semiconductor package according to the various embodiments.

Referring to FIG. 9, the semiconductor package in accordance with the embodiments may be provided in the form of a memory card 900. For example, the memory card 900 may include a memory 910 such as a nonvolatile memory device and a memory controller 920. The memory 910 and the memory controller 920 may store data or read stored data.

The memory 910 may include at least any one among nonvolatile memory devices to which the packaging technology of the embodiments of the present invention is applied. The memory controller 920 may control the memory 910 such that stored data is read out or data is stored in response to a read/write request from a host 930.

Although various embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A substrate comprising:
    a first dielectric having a first surface and a second surface which faces away from the first surface and possesses waveform shaped portions; and
    a circuit trace formed over the second surface of the first dielectric and having substantially the same waveform shaped portions as the second surface of the first dielectric.

2. The substrate according to claim 1, wherein the circuit trace includes:
    electrodes located at distal ends of the circuit trace, the electrodes being spaced apart by a connection part,
    wherein only the connection part of the circuit trace has the waveform shaped portion.

3. The substrate according to claim 2, wherein the connection part is formed substantially in a horizontal direction with respect to the second surface of the first dielectric.

4. The substrate according to claim 2, wherein the first dielectric includes:
    first holes penetrating the first surface of the first dielectric and second surfaces of the first dielectric on which the circuit trace is formed.

5. The substrate according to claim 4, wherein the circuit trace include:
    a first electrode disposed over the first hole and the adjacent portion of the second surface of the first dielectric; and
    a second electrode disposed over a portion of the second surface of the first dielectric which is spaced apart from the first electrode.

6. The substrate according to claim 5, further comprising:
    a second dielectric formed over the second surface of the first dielectric to substantially cover the circuit trace and having second holes for exposing the second electrodes of the circuit traces.

7. The substrate according to claim 5, further comprising:
    additional circuit traces formed over the first surface of the first dielectric; and
    through lines formed in the first dielectric to connect the additional circuit trace and the first electrode of the circuit trace formed over the second surface of the first dielectric.

8. The substrate according to claim 7, wherein the additional circuit trace includes:
    a third electrode connected with the through line,
    a fourth electrode disposed over a portion of the first surface of the first dielectric which is spaced apart from the third electrode, and
    an additional connection part for connecting the third and fourth electrodes.

9. The substrate according to claim 8, further comprising:
    a third dielectric formed over the first surface of the first dielectric to cover the additional circuit traces and having third holes for exposing the fourth electrodes.

10. The substrate according to claim 8, wherein the first surface of the first dielectric has a waveform shaped portion for disposing the additional connection part thereon.

11. The substrate according to claim 10, wherein the additional connection part of the circuit trace disposed over the waveform shaped portion of the first surface has a waveform shape.

12. The substrate according to claim 11, wherein the waveform shaped portion of the first surface of the first dielectric and the waveform shaped additional connection part of the additional circuit trace form an additional stress-resistant structure.

13. A semiconductor package comprising:
a substrate including
a first dielectric having a first surface and a second surface which faces away from the first surface and possesses waveform shaped portions; and
a circuit trace formed over the second surface of the first dielectric and having substantially the same waveform shaped portions as the second surface of the first dielectric
a semiconductor chip disposed over the second surface of the first dielectric and having bonding pads disposed over one surface thereof; and
first connection electrodes for electrically connecting the circuit traces of the substrate and the bonding pads of the semiconductor chip.

14. The semiconductor package according to claim 13, wherein the first dielectric includes:
first holes penetrating the first of the first dielectric and second surfaces of the first dielectric on which the circuit trace is formed.

15. The semiconductor package according to claim 14, wherein the circuit trace includes:
a first electrode disposed over the first hole and the adjacent portion of the second surface of the first dielectric; and
a second electrode disposed over a portion of the second surface of the first dielectric which is spaced apart from the first electrode.

16. The semiconductor package according to claim 15, wherein the substrate further includes:
a second dielectric formed over the second surface of the first dielectric to cover the circuit traces and having second holes for exposing the second electrodes of the circuit traces.

17. The semiconductor package according to claim 13, wherein the semiconductor chip is disposed in a face-down type such that the surface of the semiconductor chip formed with the bonding pads faces the second surface of the first dielectric,
wherein the first connection electrodes are formed over the bonding pads and include bumps which are in contact with the circuit traces.

18. The semiconductor package according to claim 15, further comprising:
second connection electrodes formed over the first surface of the first dielectric and electrically connected with the circuit traces of the substrate through the first holes, and
an encapsulation member formed over the substrate to cover the semiconductor chip and the first connection electrodes.

19. The semiconductor package according to claim 15, wherein the substrate further includes:
additional circuit traces formed over the first surface of the first dielectric; and
through lines formed in the first holes to connect the additional circuit trace and the first electrode of the circuit trace formed over the second surface of the first dielectric.

20. The semiconductor package according to claim 19, wherein the additional circuit trace includes:
a third electrode connected with the through line,
a fourth electrode disposed over a portion of the first surface of the first dielectric which is spaced apart from the third electrode, and
an additional connection part for connecting the third and fourth electrodes.

21. The semiconductor package according to claim 20, wherein the substrate further includes:
a third dielectric formed over the first surface of the first dielectric to cover the additional circuit traces and having third holes for exposing the fourth electrodes.

22. The semiconductor package according to claim 19, wherein the first surface of the first dielectric has a waveform shaped portion for disposing the additional connection part thereon.

23. The semiconductor package according to claim 22, wherein the additional connection part of the circuit trace disposed over the waveform shaped portion of the first surface has a waveform shape.

24. The semiconductor package according to claim 23, wherein the waveform shaped portion of the first surface of the first dielectric and the waveform shaped additional connection part of the additional circuit trace form an additional stress-resistant structure.

25. The semiconductor package according to claim 21, further comprising:
second connection electrodes formed over the third dielectric and electrically connected with the fourth electrodes of the additional circuit traces through the third holes.

* * * * *